US012071375B1

(12) United States Patent
Wu et al.

(10) Patent No.: US 12,071,375 B1
(45) Date of Patent: Aug. 27, 2024

(54) CEMENTED FILLING MATERIAL WITH BIONIC STRUCTURE AND PREPARATION METHOD AND APPLICATION THEREOF

(71) Applicants: CHINA UNIVERSITY OF MINING AND TECHNOLOGY, Xuzhou (CN); JIANGSU RESEARCH INSTITUTE OF BUILDING SCIENCE CO., LTD., Nanjing (CN); JIANGSU SOBUTE NEW MATERIALS CO., LTD., Nanjing (CN)

(72) Inventors: Jiangyu Wu, Xuzhou (CN); Dan Ma, Xuzhou (CN); Hao Zhang, Nanjing (CN); Qian Yin, Xuzhou (CN); Shuo Yang, Xuzhou (CN); Wen Xu, Nanjing (CN); Gaofang Zhu, Xuzhou (CN); Zhenhua Li, Xuzhou (CN); Qingbin Meng, Xuzhou (CN); Bo Meng, Xuzhou (CN); Hongwen Jing, Xuzhou (CN); Jinpeng Dai, Nanjing (CN)

(73) Assignees: CHINA UNIVERSITY OF MINING AND TECHNOLOGY, Xuzhou (CN); JIANGSU RESEARCH INSTITUTE OF BUILDING SCIENCE CO., LTD., Nanjing (CN); JIANGSU SOBUTE NEW MATERIALS CO., LTD., Nanjing (CN)

( * ) Notice: Subject to any disclaimer, the term of this patent is extended or adjusted under 35 U.S.C. 154(b) by 0 days.

(21) Appl. No.: 18/610,411

(22) Filed: Mar. 20, 2024

(30) Foreign Application Priority Data

Jun. 14, 2023 (CN) .......................... 202310704162.2

(51) Int. Cl.
*E21F 15/00* (2006.01)
*C04B 20/00* (2006.01)
*C04B 111/00* (2006.01)
*C04B 111/20* (2006.01)

(52) U.S. Cl.
CPC . *C04B 20/0008* (2013.01); *C04B 2111/00724* (2013.01); *C04B 2111/2038* (2013.01)

(58) Field of Classification Search
CPC ....... C04B 20/0008; C04B 2111/00724; C04B 2111/2038; C04B 7/00; C04B 18/00; C04B 14/062; C04B 18/146; C04B 18/04; C04B 38/0006; B28B 2003/203
See application file for complete search history.

(56) References Cited

U.S. PATENT DOCUMENTS

| | | | |
|---|---|---|---|
| 4,072,018 A | 2/1978 | Alvarez | |
| 6,635,202 B1 | 10/2003 | Bugg | |
| 9,010,053 B1 | 4/2015 | Kupferberg | |
| 2011/0033654 A1 | 2/2011 | Walmsley | |

FOREIGN PATENT DOCUMENTS

| | | | |
|---|---|---|---|
| CN | 103011662 | | 4/2013 |
| CN | 112727539 | | 4/2021 |
| CN | 215057558 | | 12/2021 |
| CN | 114149226 | | 3/2022 |
| CN | 114149226 A | * | 3/2022 |
| CN | 114856694 | | 8/2022 |
| CN | 114961726 | | 8/2022 |
| CN | 115286305 | | 11/2022 |
| CN | 115286305 A | * | 11/2022 |
| DE | 19812747 | | 9/1999 |
| EP | 0191570 | | 8/1986 |
| KR | 20170116770 | | 10/2017 |
| RU | 94238 | | 5/2010 |
| RU | 94238 U1 | * | 5/2010 |

OTHER PUBLICATIONS

RU-94238-U1, machine translation (Year: 2010).*
CN-114149226-A, machine translation (Year: 2022).*
CN-115286305-A, machine translation (Year: 2022).*
Search report from SIPO in application No. 202310704162.2 dated Sep. 8, 2023.
Search report from SIPO in application No. 202310704162.2 dated Nov. 3, 2023.
Office action from SIPO in application No. 202310704162.2 dated Sep. 11, 2023.
Notification to grant patent right for invention from SIPO in application No. 202310704162.2 dated Nov. 8, 2023.
Zhai Aifeng, et al., Design and study of high-efficient honeycomb tube filling in flotation col. Mining machinery, 006, Dec. 2012 (abstract in English).
Meng Qingbin, et al., Experimental study on formation mechanism and mechanical properties of regeneration structure of extremely weak cemented rock mass, Rock and Soil Mechanics, vol. 41, No. 3, Mar. 2020.

* cited by examiner

*Primary Examiner* — Anthony J Green
*Assistant Examiner* — Marites A Guino-O Uzzle
(74) *Attorney, Agent, or Firm* — Piloff Passino & Cosenza LLP; Rachel K. Piloff; Sean A. Passino

(57) ABSTRACT

The present disclosure provides a cemented filling material with bionic structure, a preparation method and an application thereof, and belongs to the field of structural modification methods of cemented filling materials and research and development of civil materials with ultra-high energy absorption characteristics. The cemented filling material with bionic structure includes a bionic honeycomb skeleton and cemented filling slurry, where the cemented filling slurry is poured in the bionic honeycomb skeleton.

6 Claims, 14 Drawing Sheets

CEMENTED FILLING MATERIAL WITH BIONIC STRUCTURE AND PREPARATION METHOD AND APPLICATION THEREOF

CROSS-REFERENCE TO RELATED APPLICATIONS

This disclosure claims priority to Chinese Patent Application No. 202310704162.2, filed on Jun. 14, 2023, the contents of which are hereby incorporated by reference.

TECHNICAL FIELD

The present application belongs to the field of structural modification methods of cemented filling materials and research and development of civil materials with ultra-high energy absorption characteristics, and in particular to a cemented filling material with bionic structure and a preparation method and application thereof.

BACKGROUND

The coal pillar left in the underground coal mining is a great waste of coal resources, and as the coal mining gradually goes to the deep part of the earth, the width of the coal pillar increases, the concentrated stress is enhanced, and the deformation of the coal gangs is intensified, which further affects the recovery of coal, and also triggers the disaster of the roadway surrounding rocks, which poses a serious danger to the sustainable development of coal resources.

Non-pillar roadside entry retaining roadway filling technology is the key technology to solve the deep ground pressure, maintain the stability of the roadway, and reduce the cost of roadway excavation and support and coal loss, and the use of gangue to produce cemented filling materials may realize the reduction of waste and harm, which is conducive to the safe, green and high-efficiency mining of coal mines.

Roadside cemented filling materials are widely used at present because of their outstanding advantages such as high support resistance, fast resistance increase and high mechanization degree, but whether they can safely and stably retain the roadway and solve the above problems depends on the mechanical properties of the cemented filling materials.

At present, two basic ideas are followed to strengthen the mechanical properties of cemented filling materials, one is to densify the internal pore structure of the material, and the other is to strengthen the cementing matrix and the interfacial transition zone, which involves optimizing the distribution of aggregate size, the type and amount of cemented materials, and the use of auxiliary additives, etc., and the project site will also use anchors and cable supports to further strengthen the filling body. However, all these methods fail to change the fundamental limitation that the mechanical response of cemented filling material and filling body structure is strain softening. Under the action of high stress at depth, the deformation of the surrounding rock of the tunnel continues to increase, and the brittle damage of the cemented filling material and the filling body structure greatly deteriorates the stability of the surrounding rock, resulting in economic losses and casualties.

There are two common reinforcement methods used in engineering to construct cemented filling body using cemented filling material with anchor support: reinforcement of cemented filling material and reinforcement of support. Though the above methods improve the strength, such methods still fail to solve the problem of brittle damage of cemented filling materials under high stress. Under the prolonged action of the overlying rock layer, the cemented filling material carries deformation, which not only requires sufficient strength, but also has high requirements for deformation performance.

Therefore, there is an urgent need in this field for a cemented filling material that overcomes the problem of brittle damage under high stress.

SUMMARY

Based on the above problems, the present disclosure provides a strain-hardening energy-absorbing cemented filling material from a new perspective of structural modification, which fundamentally breaks through the difficulty of applying traditional materials in deep area with high stress, ensures the stability of surrounding rock of roadside entry retaining in roadside filling, and further promotes the functional resource utilization of bulk solid waste such as gangue. At present, the brittle cemented filling materials fail to meet the requirements of sufficient strength and high deformation performance.

The present disclosure provides a structural modification method, and discloses a cemented filling material with bionic structure, including employing 3D printing of a bionic honeycomb skeleton, and then pouring a cemented filling slurry inside the skeleton: such material is a bionic energy-absorbing cemented filling material with superior energy-absorbing characteristics, which compensates for the deficiencies of the current materials and solves the existing problems in the engineering, and this structural modification realizes the strain hardening and ultra-high energy-absorbing characteristics by bionically imitating the optimal two-dimensional topology of honeycomb structure of the natural world, which fundamentally solves the problem of the stability control of the filled surrounding rock next to the roadway under the action of the high stress in the deep area.

The present disclosure provides a cemented filling material with bionic structure, including a bionic honeycomb skeleton and cemented filling slurry, where the cemented filling slurry is poured inside the bionic honeycomb skeleton.

Optionally, a side length of holes in a honeycomb unit in the bionic honeycomb skeleton is 24-60 millimeters (mm), a spacing of adjacent honeycomb layers is 6.25-25 mm, and a diameter of a honey comb bracket is 1.5 mm; and a material of the bionic honeycomb skeleton is selected from a resin, a nylon, or an aluminum alloy.

Optionally, the cemented filling material is prepared from following raw materials in parts by mass: 300-500 parts of cement, 100-150 parts of fly ash, 400-500 parts of tailings, 400-500 parts of gangue powder, 0.5-1.0 part of wood nanofibers, 5-25 parts of water reducer, 5-30 parts of composite alkali activator, 50-100 parts of silica fume, and 300-500 parts of water.

The tailings are mineral processing tailings, and the gangue powder is finely ground argillaceous gangue. In order to eliminate alkali aggregate hazards, a specific surface area of the tailings is higher than 500 square meters per kilogram ($m^2/kg$), and a specific surface area of the gangue powder is higher than 200 $m^2/kg$.

In order to facilitate underground transportation and improve the fluidity of slurry, the present disclosure does not use large-particle aggregate, but chooses gangue with particle size less than 5 mm.

The fly ash is P-grade superfine fly ash, with a CaO content of 8% or more and a specific surface area higher than 500 m$^2$/kg, which are favorable for long-term effect of alkali activation.

The water reducer is a high-efficiency polycarboxylic acid water reducer, which is beneficial to enhance the fluidity of the slurry while reducing the water content in the slurry.

The cement used in the present disclosure is composite silicate 32.5 cement, which is of low cost. The wood nanofibers selected in the present disclosure are identical to the wood nanofibers in the patent CN114149226A: wood nanofibers have good water solubility, with no requirement for ultrasonic dispersion or addition of dispersant to disperse uniformly in the process of use, and serves to strengthen the interfacial bond between the cementing matrix and the 3D printed bionic honeycomb skeleton, and bridges the cementing interface between the cementing matrix and the 3D printed honeycomb skeleton: wood nanofibers serve as the nucleation site of hydration between the cementing matrix and the 3D printed honeycomb skeleton, accelerating the generation of hydration products to bond the interface.

Optionally, the composite alkali activator includes sodium carbonate, sodium silicate and calcium hydroxide in a mass ratio of 1:1:2, which enables supplementation of an additional calcium source while ensuring adequate alkali excitation of relevant components in a reaction environment.

The present disclosure also provides a preparation method of the cemented filling material with bionic structure, includes following steps: pouring a cemented filling slurry in a bionic honeycomb skeleton.

Optionally, a preparation method of the bionic honeycomb skeleton includes following steps:
S1, designing a porous honeycomb structure by using three-dimensional modeling software, and controlling the porous honeycomb structure by setting a side length of holes in a honeycomb unit and a spacing between adjacent honeycomb layers:
S2, printing a porous honeycomb structure with an accuracy of 0.1 mm:and
S3, obtaining a bionic honeycomb skeleton through light curing 3D printing.

Optionally, a preparation method of the cemented filling slurry includes following steps:
mixing wood nanofibers, water reducer, composite alkali activator and water for 5 minutes (min), mixing well at 300 revolutions per minute (rpm), adding fly ash, tailings and gangue powder, mixing at 500 rpm for 30 min, and finally adding cement and silica fume, mixing at 500 rpm for 5 min, obtaining the cemented filling material.

The present disclosure also provides an application of the cemented filling material with bionic structure in constructing a roadside cemented filling body in underground coal mining.

The present disclosure also provides an application of the cemented filling material with bionic structure prepared by the preparation method of the cemented filling material with bionic structure in constructing a roadside cemented filling body in underground coal mining.

The present disclosure has the following beneficial effects.

As for the material, the present disclosure solves the bottleneck problem that the commonly applied cemented filling material is prone to brittle damage and difficult to adapt to the high stress conditions of deep earth engineering, and provides a cemented filling material with bionic structure from the new perspective of structural modification, which is a bionic energy-absorbing cemented filling material with strain-hardening and ultra-high energy-absorbing characteristics, and may effectively resist the long-term action of the high-stress surrounding rock in the deep area.

From the engineering point of view, the present disclosure discards the traditional method of constructing a roadside cemented filling body with anchor support components that requires a large amount of construction work and high cost, and adopts 3D printing of a bionic honeycomb skeleton, and then pours cemented materials inside the skeleton, thus proposing an integrated construction method of bionic energy-absorbing cemented filling materials, and realizing the rapid and successful construction of roadside filling along the empty retained roadways.

BRIEF DESCRIPTION OF THE DRAWINGS

In order to explain the embodiments of the present disclosure or the technical scheme in the prior art more clearly, the drawings needed in the embodiments are briefly introduced below. Obviously, the drawings in the following description are only some embodiments of the present disclosure. For ordinary people in the field, other drawings may be obtained according to these drawings without paying creative labor.

DETAILED DESCRIPTION OF THE EMBODIMENTS

Figure 1A:
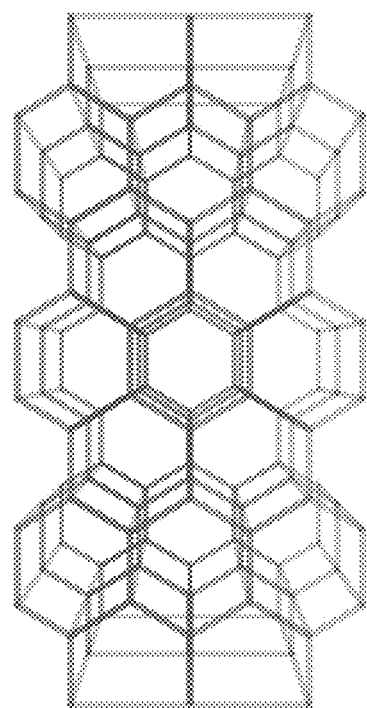
FIG. 1A shows a schematic structure of a honeycomb unit of a bionic honeycomb skeleton with a side length of 60 millimeters (mm) of holes provided by the present disclosure.
Figure 1B:
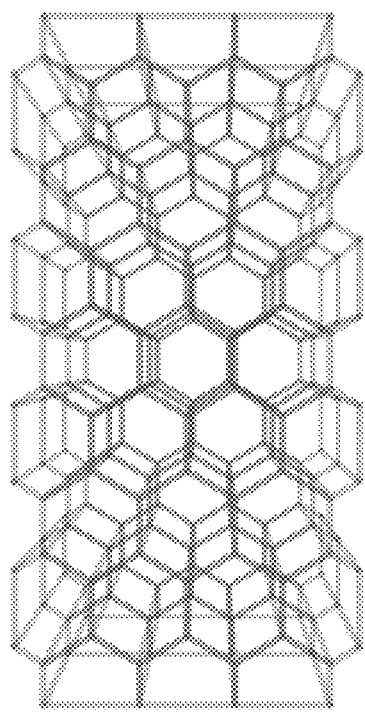
FIG. 1B shows a schematic structure of a honeycomb unit of a bionic honeycomb skeleton with a side length of 48 mm of holes provided by the present disclosure.
Figure 1C:
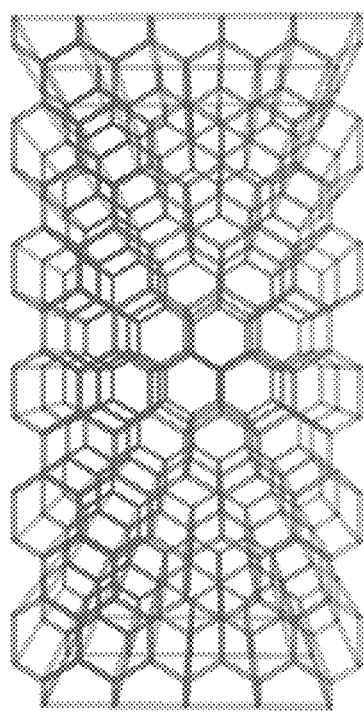
FIG. 1C shows a schematic structure of a honeycomb unit of a bionic honeycomb skeleton with a side length of 36 mm of holes provided by the present disclosure.
Figure 1D:
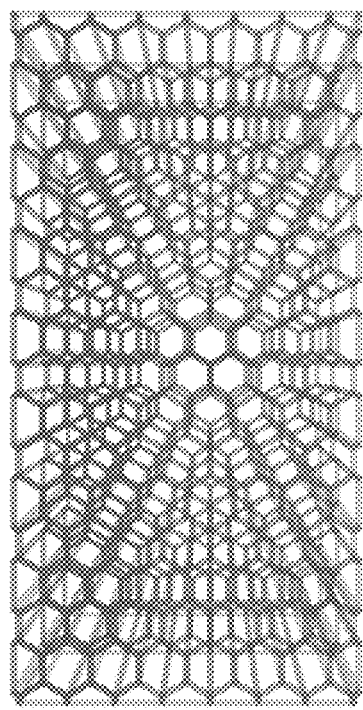
FIG. 1D shows a schematic structure of a honeycomb unit of a bionic honeycomb skeleton with a side length of 24 mm of holes provided by the present disclosure.
Figure 2A:
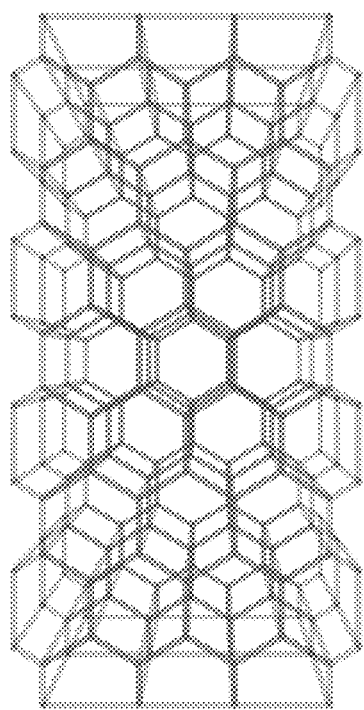
FIG. 2A shows a schematic diagram of a structure of a bionic honeycomb skeleton of the present disclosure in which a spacing between adjacent honeycomb layers is 25 mm.
Figure 2B:
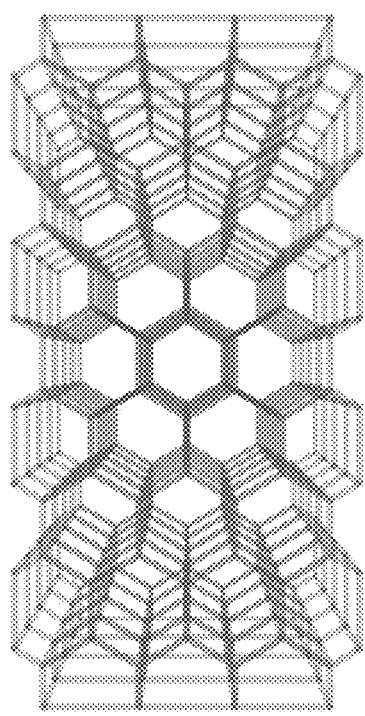
FIG. 2B shows a schematic diagram of a structure of a bionic honeycomb skeleton of the present disclosure in which a spacing between adjacent honeycomb layers is 12.5 mm.
Figure 2C:
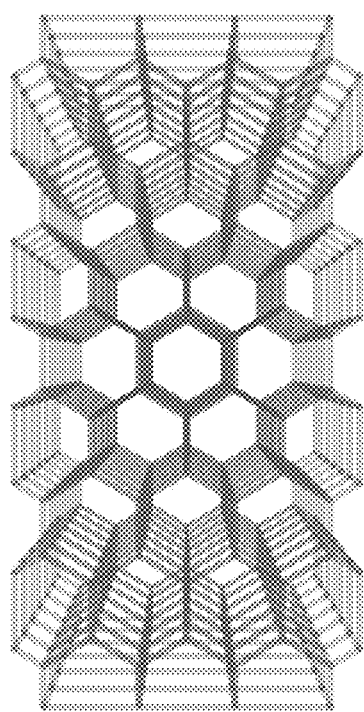
FIG. 2C shows a schematic diagram of a structure of a bionic honeycomb skeleton of the present disclosure in which a spacing between adjacent honeycomb layers is 8.33 mm.
Figure 2D:
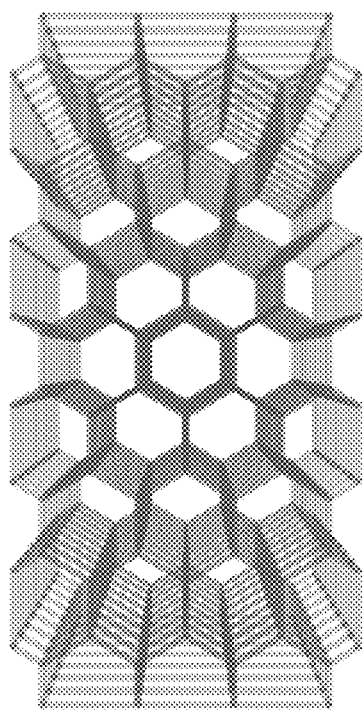
FIG. 2D shows a schematic diagram of a structure of a bionic honeycomb skeleton of the present disclosure in which a spacing between adjacent honeycomb layers is 6.25 mm.

A number of exemplary embodiments of the present disclosure are now described in detail, and this detailed description should not be considered as a limitation of the present disclosure, but should be understood as a more detailed description of certain aspects, characteristics and embodiments of the present disclosure.

It should be understood that the terminology described in the present disclosure is only for describing specific embodiments and is not used to limit the present disclosure. In addition, for the numerical range in the present disclosure, it should be understood that each intermediate value between the upper limit and the lower limit of the range is also specifically disclosed. The intermediate value within any stated value or stated range and every smaller range between any other stated value or intermediate value within the stated range are also included in the present disclosure. The upper and lower limits of these smaller ranges can be independently included or excluded from the range.

Unless otherwise specified, all technical and scientific terms used herein have the same meaning as commonly understood by one of ordinary skill in the art to which this present disclosure relates. Although the present disclosure only describes the optional methods and materials, any methods and materials similar or equivalent to those described herein can also be used in the practice or testing of the present disclosure. All documents mentioned in this specification are incorporated by reference to disclose and describe methods and/or materials related to the documents. In case of conflict with any incorporated document, the contents of this specification shall prevail.

It is obvious to those skilled in the art that many improvements and changes may be made to the specific embodiments of the present disclosure without departing from the scope or spirit of the present disclosure. Other embodiments will be apparent to the skilled person from the description of the present disclosure. The specification and embodiments of this disclosure are only exemplary.

The terms "including", "comprising", "having" and "containing" used in this specification are all open terms, which means including but not limited to.

The present disclosure provides a cemented filling material with bionic structure, including a bionic honeycomb skeleton and a cemented filling slurry, where the cemented filling slurry is poured inside the bionic honeycomb skeleton.

In order to facilitate the pouring of cemented filling slurry, it is necessary to set the side length of the holes in the honeycomb unit and the spacing of adjacent honeycomb layers for controlling the porous honeycomb structure, controlling the size of the honeycomb holes through the side length of the holes in the honeycomb unit as well as controlling the spatial density of the honeycomb layers through the spacing of adjacent honeycomb layers. The holes in the honeycomb unit are too large when the side length of the holes is too large, causing the honeycomb structure to be sparse, and the mechanical hardening and energy-absorbing effect is greatly reduced: when the side length of the holes in the honeycomb unit is too small, the holes in the honeycomb are too small, which causes difficulties in pouring slurry and deterioration of the internal bubbles: when the spacing of neighboring honeycomb layers is too large and the density of the space of the honeycomb layer is too low, the internal honeycomb structure is invalid, and it is not capable of forming an energy-absorbing skeleton: when the spacing of neighboring honeycomb layers is too small and the space density of the space of the honeycomb layer is too high, the effect of energy-absorbing effect is not obvious and the waste of materials is caused.

Therefore, in some preferred embodiments, the side length of the holes in the honeycomb units in the bionic honeycomb skeleton is 24-60 millimeters (mm), the spacing between adjacent honeycomb layers is 6.25-25 mm, and the diameter of the honeycomb bracket is 1.5 mm.

FIG. 1A, FIG. 1B, FIG. 1C and FIG. 1D are schematic diagrams of the structure of the honeycomb unit of the bionic honeycomb skeleton of the present disclosure in which the side lengths of the holes in the honeycomb unit are 60, 48, 36, and 24 mm in descending order:and FIG. 2A, FIG. 2B, FIG. 2C and FIG. 2D are schematic diagrams of the structure of the bionic honeycomb skeleton of the present disclosure in which the spacing of the neighboring honeycomb layers of the bionic honeycomb skeleton is 25, 12.5, 8.33, and 6.25 mm in descending order.

Since the material of the bionic honeycomb skeleton affects the toughness of the skeleton, the interfacial bonding between the cemented filling slurry and the skeleton, and the energy-absorbing properties of the cemented filling material with bionic structure, it is desirable to select a material that is tensile and tough, with a rough surface as well as good matching with the alkaline cemented filling slurry, and therefore the material of the bionic honeycomb skeleton is selected from a resin, nylon, or an aluminum alloy in some preferred embodiments of the present disclosure.

In some optional embodiments of the present disclosure, the cemented filling material is prepared from the following raw materials in parts by mass: 300-500 parts of cement, 100-150 parts of fly ash, 400-500 parts of tailings, 400-500 parts of gangue powder, 0.5-1.0 part of wood nanofibers, 5-25 parts of water reducer, 5-30 parts of composite alkali activator, 50-100 parts of silica fume, and 300-500 parts of water.

In some preferred embodiments of the present disclosure, the complex alkali activator includes sodium carbonate, sodium silicate and calcium hydroxide in a mass ratio of 1:1:2.

The embodiments of the present disclosure also provide a preparation method of the cemented filling material with bionic structure, including the following steps: pouring the cemented filling slurry inside the bionic honeycomb skeleton.

Figure 6:
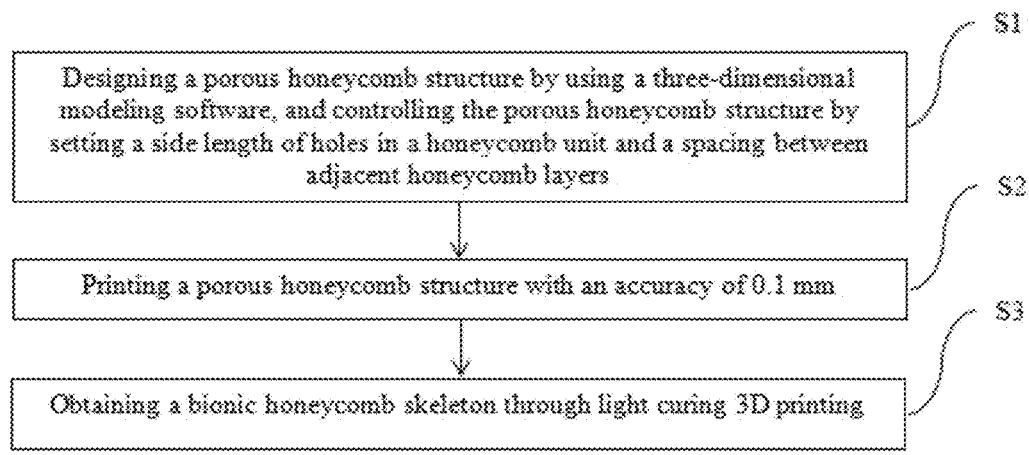
FIG. 6 shows a process of a preparation method of the bionic honeycomb skeleton provided in the present disclosure.

In some optional embodiments of the present disclosure, the preparation method of the bionic honeycomb skeleton includes the following steps as shown in FIG. 6:

S1, designing a porous honeycomb structure by using a three-dimensional modeling software, and controlling the porous honeycomb structure by setting a side length of holes in a honeycomb unit and a spacing between adjacent honeycomb layers;

S2, printing a porous honeycomb structure with an accuracy of 0.1 mm; and

S3, obtaining a bionic honeycomb skeleton through light curing 3D printing.

In some optional embodiments of the present disclosure, the preparation method of the cemented filling slurry includes the following steps:

mixing wood nanofibers, water reducer, composite alkali activator and water for 5 min, stirring well at 300 rpm, adding fly ash, tailings and gangue powder, stirring at 500 rpm for 30 min, and finally adding cement and silica fume, stirring at 500 rpm for 5 min, obtaining the cemented filling material.

The embodiments of the present disclosure also provide an application of the cemented filling material with bionic structure in constructing a roadside cemented filling body in underground coal mining.

The embodiments of the present disclosure also provide an application of the cemented filling material with bionic structure prepared by the above preparation method in constructing a roadside cemented filling body in underground coal mining.

The cement in the embodiments of the present disclosure is composite silicate 32.5 cement; the water reducer is a high-efficiency polycarboxylic acid water reducer.

"Parts" used in the embodiments of the present disclosure are all "parts by weight" unless otherwise specified.

Embodiment 1

Preparation of Cemented Filling Slurry

S1, mixing 1 part of wood nanofibers, 5 parts of water reducer, 20 parts of composite alkali activator (composed of sodium carbonate, sodium silicate and calcium hydroxide in a mass ratio of 1:1:2) and 500 parts of water, and stirring at 300 rpm for 5 min to obtain a mixture 1;

S2, sequentially adding 100 parts of fly ash, 500 parts of tailings and 1000 parts of gangue powder into the mixture 1, and stirring at a high speed of 500 rpm for 30 min to obtain a mixture 2; and S3, mixing the mixture 2 with 500 parts of cement and 100 parts of silica fume, and stirring at a high speed of 500 rpm for 5 min to prepare the cemented filling slurry.

Embodiment 2

Preparation method of a bionic energy-absorbing cemented filling material

3D Printing of Bionic Honeycomb Skeleton

S1, designing a porous honeycomb structure by using a three-dimensional modeling software, and setting a side length of holes in a honeycomb unit to be 60 mm and a spacing between adjacent honeycomb layers to be 25 mm;

S2, setting a diameter of a honeycomb bracket as 1.5 mm, and printing a porous honeycomb structure using resin with an accuracy of 0.1 mm; and S3, obtaining a bionic honeycomb skeleton through light curing 3D printing.

Figure 3:
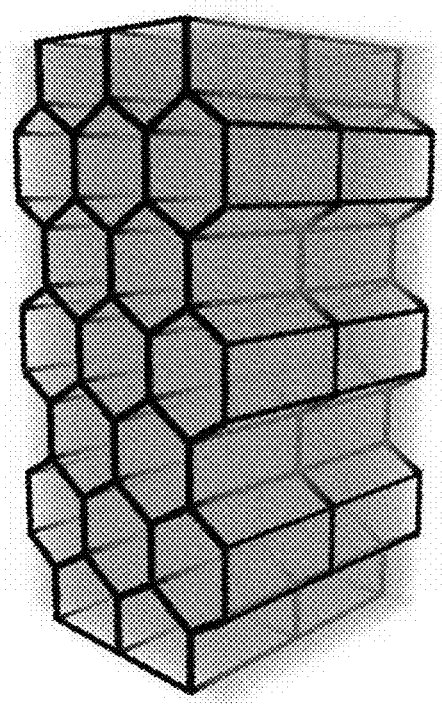
FIG. 3 is a schematic diagram of a cemented filling material with bionic structure obtained in Embodiment 2.
Figure 4A:
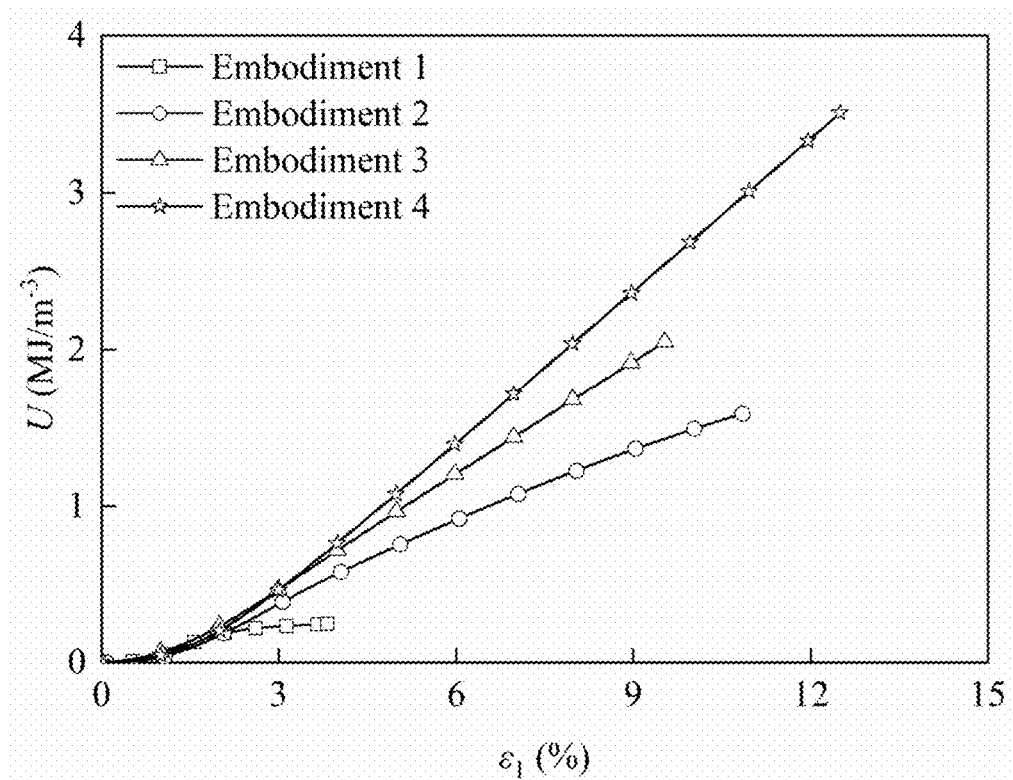
FIG. 4A shows stress-strain comparisons of the cemented filling slurry obtained in Embodiment 1 and the bionic energy-absorbing cemented filling material obtained in Embodiments 2-4.
Figure 4B:
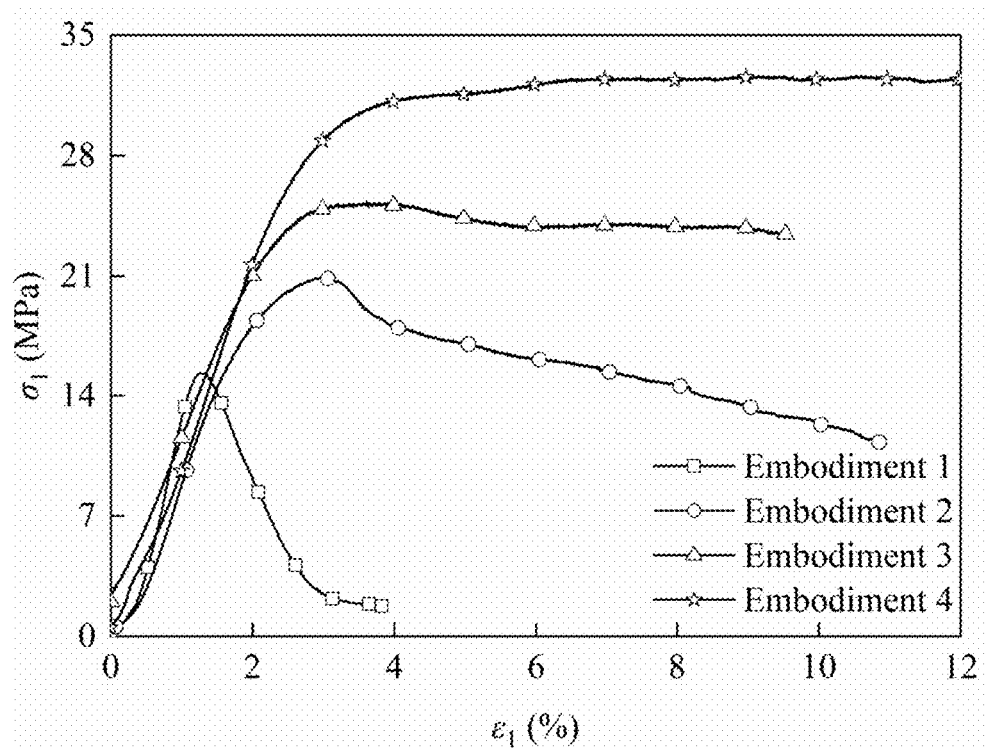
FIG. 4B shows energy-strain comparisons of the cemented filling slurry obtained in Embodiment 1 and the bionic energy-absorbing cemented filling material obtained in Embodiments 2-4.

The cemented filling slurry obtained in Embodiment 1 is poured into the bionic honeycomb skeleton and cured for 28 days (temperature 25° C., humidity 95%) to obtain a bionic energy-absorbing cemented filling material. FIG. 3 is a schematic diagram of the cemented filling material with bionic structure obtained in the present embodiment.

Embodiment 3

Preparation Method of Bionic Energy-Absorbing Cemented Filling Material

3D Printing of Bionic Honeycomb Skeleton

S1, designing a porous honeycomb structure by using three-dimensional modeling software, setting the side length of holes in a honeycomb unit to be 24 mm and controlling the distance between adjacent honeycomb layers to be 8.5 mm;

S2, setting the diameter of the honeycomb bracket as 1.5 mm, and printing a porous honeycomb structure with resin with the accuracy of 0.1 mm; and S3, obtaining a bionic honeycomb skeleton through light curing 3D printing.

The cemented filling slurry obtained in Embodiment 1 is poured into the bionic honeycomb skeleton to obtain a bionic energy-absorbing cemented filling material.

Embodiment 4

Preparation Method of Bionic Energy-Absorbing Cemented Filling Material

3D Printing of Bionic Honeycomb Skeleton

S1, designing a porous honeycomb structure by using three-dimensional modeling software, setting the side length of holes in a honeycomb unit to be 32 mm and controlling the distance between adjacent honeycomb layers to be 12.5 mm;

S2, setting the diameter of the honeycomb bracket as 1.5 mm, and printing a porous honeycomb structure by using aluminum alloy with the accuracy of 0.1 mm; and S3, obtaining a bionic honeycomb skeleton through light curing 3D printing.

The cemented filling slurry obtained in Embodiment 1 is poured into the bionic honeycomb skeleton to obtain a bionic energy-absorbing cemented filling material.

Comparative Embodiment 1

Preparation of a Common Cemented Filling Material

S1, mixing 5 parts of water reducer and 500 parts of water, and stirring at 300 rpm for 5 min to obtain a mixture 1;

S2, sequentially adding 100 parts of fly ash, 500 parts of tailings and 1000 parts of gangue powder into the mixture 1, and stirring at a high speed of 500 rpm for 30 min to obtain a mixture 2; and S3, mixing the mixture 2 with 500 parts of cement and 100 parts of silica fume, and stirring at a high speed of 500 rpm for 5 min to prepare cemented filling slurry.

Comparative Embodiment 2

S1, mixing 5 parts of water reducer, 20 parts of composite alkali activator (composed of sodium carbonate, sodium silicate and calcium hydroxide in a mass ratio of 1:1:2) and 500 parts of water, and stirring at 300 rpm for 5 min to obtain a mixture 1;

S2, sequentially adding 100 parts of fly ash, 500 parts of tailings and 1000 parts of gangue powder into the mixture 1, and stirring at a high speed of 500 rpm for 30 min to obtain a mixture 2; and S3, mixing the mixture 2 with 500 parts of cement and 100 parts of silica fume, and stirring at a high speed of 500 rpm for 5 min to prepare cemented filling slurry.

Comparative Embodiment 3

Same as Embodiment 2, the only difference is that the length of the hole side in the honeycomb unit is 72 mm and the spacing between adjacent honeycomb layers is 50 mm.

Comparative Embodiment 4

The preparation method of cemented filling slurry is the same as that in Embodiment 1, except that wood nanofibers are not added, and the prepared cemented filling slurry is poured into the bionic honeycomb skeleton obtained in Embodiment 2 to obtain a bionic energy-absorbing cemented filling material.

Comparative Embodiment 5

The preparation method of cemented filling slurry is the same as that in Embodiment 1, except that no water reducer is added, and the prepared cemented filling slurry is poured into the bionic honeycomb skeleton obtained in Embodiment 2 to obtain a bionic energy-absorbing cemented filling material.

Comparative Embodiment 6

The preparation method of cemented filling slurry is the same as that in Embodiment 1, except that the composite alkali activator is not added, and the prepared cemented filling slurry is poured into the bionic honeycomb skeleton obtained in Embodiment 2 to obtain a bionic energy-absorbing cemented filling material.

Comparative Embodiment 7

The difference is only that the honeycomb skeleton is made of nylon.

Performance Verification Embodiment 1

The compressive strength, peak strain, absorbed energy corresponding to peak point and maximum absorbed energy of the products obtained in the above embodiments and comparative embodiments are measured by uniaxial compression test, and the results are shown in Table 1.

TABLE 1

| Cases | Compressive strength MPa | peak strain % | Peak absorption energy MJ/m$^3$ | Maximum value of absorbed energy MJ/m$^3$ |
|---|---|---|---|---|
| Embodiment 1 | 15.34 | 1.27 | 0.086 | 0.247 |
| Embodiment 2 | 20.92 | 3.05 | 0.384 | 1.589 |
| Embodiment 3 | 32.68 | 9.01 | 2.376 | 3.508 |
| Embodiment 4 | 42.37 | 15.26 | 5.251 | 7.753 |
| Comparative embodiment 1 | 7.87 | 1.21 | 0.027 | 0.101 |
| Comparative embodiment 2 | 12.11 | 1.25 | 0.032 | 0.142 |
| Comparative embodiment 3 | 16.96 | 2.24 | 0.253 | 0.986 |
| Comparative embodiment 4 | 16.03 | 2.68 | 0.234 | 1.072 |
| Comparative embodiment 5 | 18.24 | 2.82 | 0.345 | 1.395 |
| Comparative embodiment 6 | 17.55 | 2.59 | 0.298 | 1.111 |
| Comparative embodiment 7 | 26.09 | 7.00 | 1.511 | 2.320 |

As can be seen from Table 1, as compared to Embodiment 1, Embodiment 2 enhances the aforementioned properties (compressive strength, peak strain, absorption energy corresponding to peak point, maximum absorption energy) of the resulting cemented filling material with bionic structure due to the strong honeycomb structure restraining the deformation of the cementing matrix by pouring the cemented filling slurry into the bionic honeycomb, while the wood nanofibers and the composite alkali activator in the cemented filling slurry enhances the bonding properties of the interface between the slurry and the honeycomb bracket.

Compared with Embodiment 2, the honeycomb skeleton material of Embodiment 3 is unchanged, the honeycomb holes are narrowed and the spatial density of the honeycomb layer is increased, which improves the strength and deformation characteristics of the honeycomb structure, so that the above properties are improved.

The honeycomb holes in Embodiment 4 are larger and the spatial density of the honeycomb layer is smaller compared to Embodiment 3, but the above performance is still improved because Embodiment 4 is made of an aluminium alloy, which has mechanical properties superior to those of the resin, allowing for improved performance as described above.

In contrast to Embodiment 1, the removal of the wood nanofibers and the composite alkali activator in Comparative embodiment 1 causes a decrease in the above mentioned properties due to the lack of wood nanofibers as nucleation sites for the hydration reaction, the difficulty of the hydration products to completely fill the bonded tiny pores, and the lack of alkali activator molecules to activate the potential activity of gangue powder and fly ash.

The decrease in performance of Comparative embodiment 2 compared to Embodiment 1, where only the wood nanofibers are removed, is a result of the loss of the filling effect of the wood nanofibers on the tiny pores and fissures, the reduction of the nucleation sites of the hydration reaction between the micropores in the system, and the reduction of the strength of the cementing matrix.

The material is not changed in Comparative embodiment 3 compared to that of Embodiment 2, but the above properties are deteriorated due to larger honeycomb pores and less spatial density of the honeycomb layer, which is caused by a reduction in the strength and toughness of the honeycomb structure and a weakening of the constraints on the cemented substrate.

In contrast to Embodiment 2, the removal of the wood nanofibers from the added cemented filling slurry in Comparative embodiment 4 results in a significant weakening of the interfacial bond between the cementing matrix and the honeycomb bracket, resulting in a decrease in the performance of the formation of the above mentioned properties.

In contrast to Embodiment 5, the water reducer is removed from the added cemented filling slurry compared to Embodiment 2, which makes the flowability of the cemented filling slurry greatly weakened, making it unfavourable for the cemented filling material with bionic structure to be poured, with coarse pore structure being formed internally, resulting in a decrease in the performance of the formation of the above mentioned properties.

In contrast to Embodiment 2, the removal of the composite alkali activator from the added cemented filling slurry in Comparative embodiment 6 leaves the potential activity of gangue powder and fly ash insufficiently stimulated, resulting in degradation of the properties described above.

In comparison to Embodiment 2, the mechanical properties of the nylon as well as the bonding properties and the matching properties with the cemented filling slurry are varied due to the change in the material of the honeycomb bracket in Comparative embodiment 7, resulting in the improvement of the above properties.

Performance Verification Embodiment 2

The corresponding mechanical-energy curves of the above Embodiments 1-4 are determined by uniaxial compression tests, and the results are shown in FIG. 4A, FIG. 4B, FIG. 5A and FIG. 5B. As can be seen from FIG. 4A and FIG. 4B, the cemented filling slurry obtained in Embodiment 1 is destroyed at the strain of 1%-1.5%, and the absorbed energy is usually lower than 0.1 MJ/m$^{-3}$, proving that the use of ultra-high-performance wood nanofibers and composite alkali exciters for modification is conducive to the strengthening of the mechanical properties of the cemented filling material, but it is still a brittle material, which is not applicable to the environment of high stress and strong disturbance in the deep area, and the material is susceptible to brittle damage. The cemented filling material with bionic structure developed by the present disclosure benefits from the implantation of the bionic honeycomb skeleton, and the mechanical strength and energy absorption are greatly improved, with the strength increased by more than two times, the peak strain increased to 3%-20%, and the absorbed energy is as high as 0.3-8 MJ/m$^{-3}$, which is greatly more than the cemented filling slurry obtained in Embodiment 1.

Figure 5A:
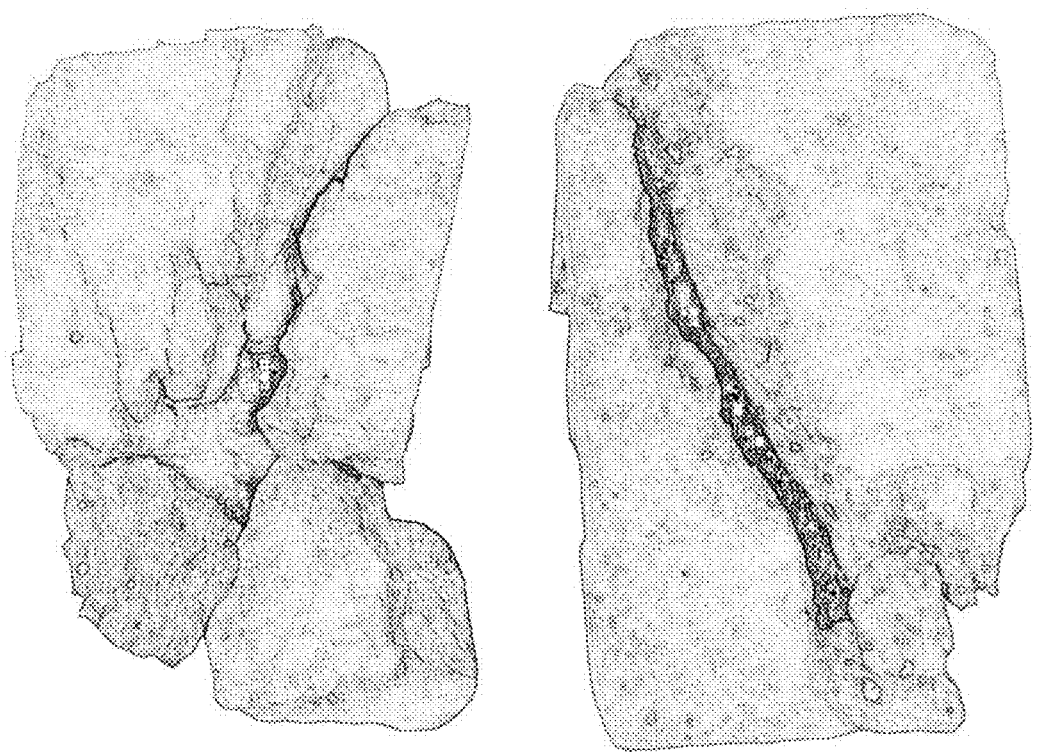
FIG. 5A is a photo of the macro-failure effect of the ordinary cemented filling slurry in Comparative embodiment 1.
Figure 5B:
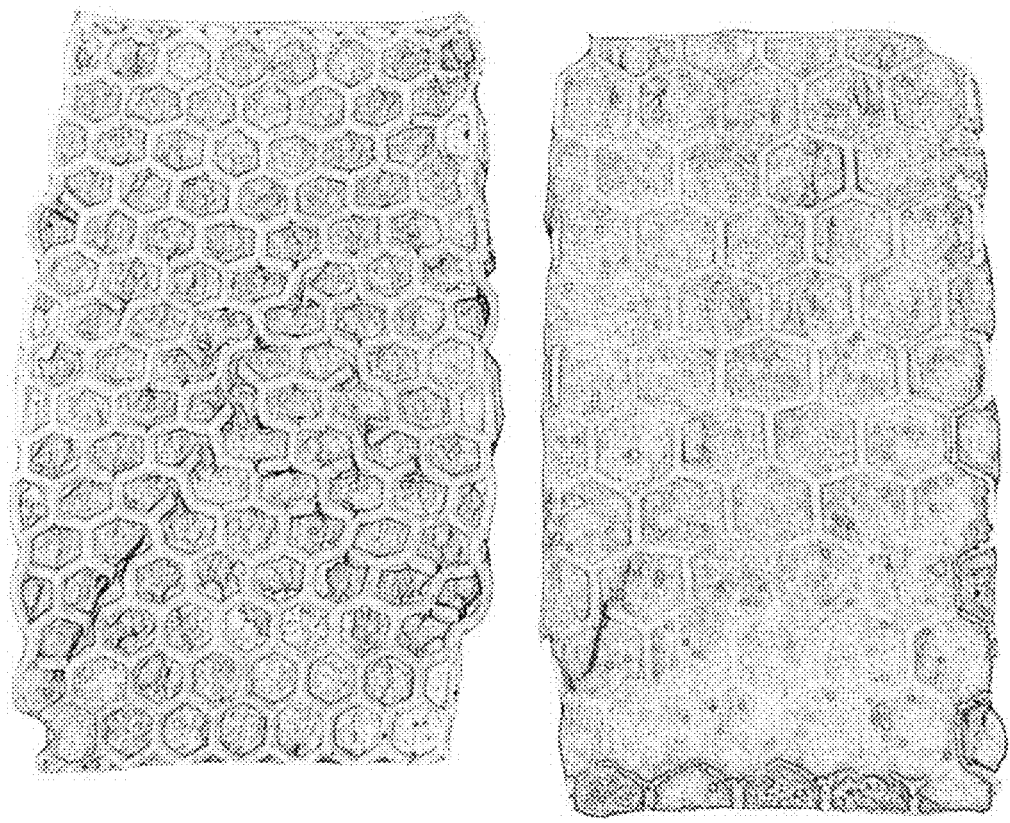
FIG. 5B shows photographs of the macroscopic damage effects of the cemented filling material with bionic structures of Embodiments 2 and 3.

Uniaxial compression tests are performed on the cemented filling material with bionic structures of Embodiments 2 and 3 and on the ordinary cemented filling slurry of Comparative embodiment 1. FIG. 5A and FIG. 5B show comparisons of macroscopic damage characteristics, where FIG. 5A is a photograph of the macroscopic damage of the ordinary cemented filling material in Comparative embodiment 1, and FIG. 5B is a photograph of the macroscopic damage of the cemented filling material with bionic structure of Embodiments 2 and 3.

As can be seen from FIG. 5A, the ordinary cemented filling slurry of Comparative embodiment 1 undergoes damage after a load-bearing strain of 1.5%, producing a macroscopic rupture surface:and from FIG. 5B, it is observed that the biomimetic structural cemented filling materials provided in Embodiments 2 and 3 of the present disclosure exhibit load-bearing strains as high as 20%, with no obvious rupture surface, and the materials show obvious structural hardening characteristics.

The above-mentioned embodiments only describe the preferred mode of the present disclosure, and do not limit the scope of the present disclosure. Under the premise of not departing from the design spirit of the present disclosure, various modifications and improvements made by ordinary technicians in the field to the technical scheme of the present disclosure shall fall within the protection scope determined by the claims of the present disclosure.

What is claimed is:

1. A cemented filling material with bionic structure, comprising a bionic honeycomb skeleton and cemented filling slurry, wherein the cemented filling slurry is poured in the bionic honeycomb skeleton;
   a side length of holes in a honeycomb unit in the bionic honeycomb skeleton is 24-60 mm, a spacing of adjacent honeycomb layers is 6.25-25 mm, and a diameter of a honeycomb bracket is 1.5 mm; and
   the cemented filling material is prepared from following raw materials in parts by mass: 300-500 parts of cement, 100-150 parts of fly ash, 400-500 parts of tailings, 400-500 parts of gangue powder, 0.5-1.0 part of wood nanofibers, 5-25 parts of water reducer, 5-30 parts of composite alkali activator, 50-100 parts of silica fume, and 300-500 parts of water.

2. The cemented filling material with bionic structure according to claim 1, wherein a material of the bionic honeycomb skeleton is selected from a resin, a nylon, or an aluminum alloy.

3. The cemented filling material with bionic structure according to claim 1, wherein the composite alkali activator comprises sodium carbonate, sodium silicate and calcium hydroxide in a mass ratio of 1:1:2.

4. A preparation method of the cemented filling material with bionic structure according to claim 1, comprising a following step: pouring the cemented filling slurry into the bionic honeycomb skeleton.

5. The preparation method according to claim 4, wherein the bionic honeycomb skeleton is prepared by 3D printing, with a preparation method comprising:
   S1, designing a porous honeycomb structure by using a three-dimensional modeling software, and controlling the porous honeycomb structure by setting a side length of holes in a honeycomb unit and a spacing between adjacent honeycomb layers;
   S2, printing the porous honeycomb structure with an accuracy of 0.1 mm; and
   S3, obtaining the bionic honeycomb skeleton through light curing 3D printing.

6. The preparation method according to claim 4, wherein a preparation method of the cemented filling slurry comprises:
   mixing wood nanofibers, water reducer, composite alkali activator and water for 5 min, stirring evenly at 300 rpm, adding fly ash, tailings and gangue powder, stirring at 500 rpm for 30 min, and finally adding cement and silica fume, stirring at 500 rpm for 5 min, and obtaining the cemented filling material.

* * * * *